United States Patent
Hirano et al.

(10) Patent No.: US 6,563,387 B2
(45) Date of Patent: May 13, 2003

(54) METHOD AND APPARATUS FOR SYNTHESIZING HIGH-FREQUENCY SIGNALS FOR WIRELESS COMMUNICATIONS

(75) Inventors: Shunsuke Hirano, Yokohama (JP); Ryoichi Yamada, Yokosuka (JP); Yasunori Miyahara, Ayase (JP); Yukio Hiraoka, Nishinomiya (JP); Hisashi Adachi, Minoo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 42 days.

(21) Appl. No.: 09/867,348

(22) Filed: May 29, 2001

(65) Prior Publication Data

US 2001/0052823 A1 Dec. 20, 2001

(30) Foreign Application Priority Data

May 30, 2000 (JP) ........................................ 2000-160842

(51) Int. Cl.$^7$ .......................... H03L 7/087; H03L 7/099
(52) U.S. Cl. ............................. 331/11; 331/14; 331/17; 331/25; 331/36 C; 331/36 L; 331/179; 327/156; 327/157; 375/376; 455/260
(58) Field of Search ................................. 331/1 A, 4, 8, 331/10, 11, 14, 16, 17, 25, 36 C, 36 L, DIG. 2, 179; 327/156–159; 360/51; 375/376; 455/260

(56) References Cited

U.S. PATENT DOCUMENTS 5,648,744 A   7/1997   Prakash et al.

6,137,372 A * 10/2000 Welland ................. 331/117 R

FOREIGN PATENT DOCUMENTS

JP   10-261918   9/1998

* cited by examiner

Primary Examiner—David C. Mis
(74) Attorney, Agent, or Firm—Pearne & Gordon LLP

(57) ABSTRACT

A frequency synthesizer is provided with a prescaler 2 and a counter 3, which output a signal having a frequency generated by frequency-dividing an output signal of a VCO 1; a reference frequency divider 5 for frequency-dividing a frequency of a reference signal of a reference signal source 4; a frequency adjusting meas 9 operated in such that a frequency error between the output signal of the counter 5 and the output signal of the reference frequency divider 5 is detected, and in response to this detection result, such a signal is outputted by which either a capacitor value or an inductor value employed in a resonant circuit of the VCO 1 is switched; and also a bias control means for applying an arbitrary voltage V1 to a control voltage terminal of the VCO 1 so as to bring an output signal of a charge pump 7 into a high impedance state when the frequency adjusting means 9 is operated. Since the resonant frequency of the resonant circuit is changed in response to an actual oscillation frequency of the VCO 1, the frequency synthesizer can be phase-locked at a desirable frequency. Also, since the VCO can be manufactured in the IC form, the compact VCO can be made in low cost.

22 Claims, 5 Drawing Sheets

METHOD AND APPARATUS FOR SYNTHESIZING HIGH-FREQUENCY SIGNALS FOR WIRELESS COMMUNICATIONS

BACKGROUND OF THE INVENTION

1. Field of the Invention

The present invention generally relates to a frequency synthesizer used in a wireless mobile appliance, and more specifically, to a frequency synthesizer capable of manufacturing a VCO in an IC form, resulting in low cost.

2. Description of the Related Art

In wireless mobile appliances such as portable telephones, frequency synthesizers are used to generate arbitrary local oscillation frequencies from a reference signal.

In general, as indicated in FIG. 5, a frequency synthesizer used in a wireless mobile appliance such as a portable telephone is equipped with a VCO 1, a prescaler 2, a counter 3, a reference frequency divider 5, a phase comparator 6, a charge pump 7, and a loop filter 8. Both the prescaler 2 and the counter 3 constitute a pulse-swallow type variable frequency divider. The VCO 1 oscillates a signal having a frequency in response to a voltage which is applied to a frequency control voltage terminal of the frequency synthesizer. The prescaler 2 divides a frequency of an output signal (will be referred to as an "$f_{VCO}$" hereinafter) of the VCO 1. The counter 3 counts the output signal of the prescaler 2. The reference frequency divider 5 divides a frequency of an output signal (will be referred to as an "$f_{OSC}$" hereinafter) of a reference signal source 4. The phase comparator 6 compares a phase of an output signal (will be referred to as an "$f_{div}$" hereinafter) of the counter 3 with a phase of an output signal (will be referred to as an "$f_{ref}$" hereinafter) of the reference frequency divider 5 to thereby output a phase difference. The charge pump 7 converts the output signal of the phase comparator 6 into either a voltage or a current. The loop filter 8 averages the output signal of the charge pump 7.

FIG. 6 is a circuit diagram for representing a basic operation of the VCO disclosed in Japanese Laid-open Patent Application No. Hei-10-261918. This circuit is provided with the capacitor "C0", the negative-characteristic resistive portion "−R", and the inductor "L", which are connected in parallel to each other. This circuit is further equipped with the capacitor "C1" and the variable capacitance diode "Cv", which are connected in the cascade connection. This cascade connection between the capacitor C1 and the variable capacitance diode "Cv" is connected in parallel to the capacitor C0.

Next, operations of the circuit shown in FIG. 6 will now be explained. The parallel connection portion constructed of the negative-characteristic resistive portion "−R", the capacitor "C0", and the inductor "L" corresponds to a parallel resonant circuit containing an active element which generates electric power of a transistor and the like, to which the power supply voltage is applied. The negative-characteristic resistive portion "−R" is different from the normal resistor, considering such an implication that electric power is generated.

The oscillation frequency of this VCO is expressed by the following formula [1]:

$$f_{VCO} = 1/2\pi \sqrt{L[C0 + C1 \cdot Cv/(C1+Cv)]} \quad [1]$$

In the case that this voltage-controlled oscillator is employed in the frequency synthesizer of FIG. 5, the control voltage is applied to the variable capacitance diode "Cv", so that the capacitance value of the variable capacitance diode "Cv" is varied. As a result, the oscillation frequency "$f_{VCO}$" is varied.

In such a frequency synthesizer, when the count value of the counter 3 is changed, the frequency "$f_{div}$" is changed in response to this change in the count values. As a result, the phase comparator 6 outputs the phase error. Based upon this phase error, voltage of the frequency control voltage terminal of the VCO 1 is changed via the charge pump 7 and the loop filter 8 so as to vary the frequency "$f_{VCO}$." As previously explained, the frequency synthesizer constitutes the negative feedback loop, and finally locks the phase when the phase of the frequency "$f_{ref}$" is made coincident with the phase of the frequency "$f_{div}$", so that the output frequency of the VCO 1 can be made stable.

Generally speaking, in such a frequency synthesizer, a VCO is constituted by a module component. This module component will constitute one of major factors which may impede a compactness of a portable telephone and the like. Thus, such a VCO is desirably manufactured in the form of an IC component. However, in the case that such a VCO is manufactured in the IC component form, an oscillation frequency of this VCO would be largely varied due to manufacturing fluctuations occurred in electronic components for constituting this VCO. As a result, there is such a problem that the frequency synthesizer could not be phase-locked at the desirable frequency.

To solve this problem, there is one method capable of increasing a control sensitivity (namely, change width of oscillation frequency per 1V: unit being [Hz/V]). However, if the control sensitivity is increased, then there is another problem. That is, when the control sensitivity is increased, the frequency synthesizer may be easily and adversely influenced by outer disturbance noise, so that the CPU characteristic would be deteriorated.

Also, there is a further method for solving the above-explained problem. That is, in this method, a plurality of fixed capacitances are connected in parallel to a parallel resonant circuit of a VCO, and when this VCO is manufactured in the IC component form, these fixed capacitances are trimmed by laser and the like so as to set the oscillation frequency of the VCO. However, since the IC is separately adjusted, the manufacturing cost would be increased, resulting in another problem.

SUMMARY OF THE INVENTION

The present invention has been made to solve the above-described conventional problems, and therefore, has an object to provide a frequency synthesizer having a better C/N characteristic, by which a VCO having a wide output frequency range can be manufactured in an IC form, while realizing low cost.

To achieve the above-explained object, a frequency synthesizer, according to the present invention, is featured, by that in a frequency synthesizer having a switching means for switching a capacitor, or an inductor; and equipped with: a voltage-controlled oscillator (will be referred to as a "VCO" hereinafter) for oscillating a signal having a frequency in response to a voltage applied to a control voltage terminal; a first frequency divider for outputting a signal having a frequency which is obtained by dividing a frequency of an output signal derived from the VCO; a second frequency divider for dividing a frequency of a reference signal; a phase comparator for comparing a phase of an output signal of the first frequency divider with a phase of an output signal of the second frequency divider to output a phase difference thereof; and a charge pump for outputting the output signal of the phase comparator via a loop filter to a control voltage terminal of the VCO, the frequency synthesizer is comprised of: frequency adjusting means for detecting a frequency error between both the output signal of the first frequency divider and the output signal of the second frequency divider, and for switching the capacitor value of the VCO, or the inductor value thereof in accordance with the detection result of the frequency error; and bias control means for applying an arbitrary voltage to the control voltage terminal of the VCO in order that the output signal of the charge pump is brought into a high impedance state when the frequency adjusting means is operated. With employment of such an arrangement, even when there is a manufacturing fluctuation occurred in the electronic components which constitute the VCO, since the resonant frequency of the parallel resonant circuit is varied in response to the actual oscillation frequency of the VCO, the phase can be locked at a desirable frequency. Furthermore, since the VCO can be manufactured in the IC form, the VCO can be made compact as well as in low cost.

Also, the frequency synthesizer is featured by that the VCO is equipped with a plurality of means for switching capacitors, or inductors. With employment of this arrangement, since the resonant frequencies are switched in a fine mode, the control sensitivity of the VCO can be lowered, and thus, the C/N characteristic can be improved.

Further, the frequency synthesizer is featured by comprising: first and second counters for counting the output signal of the first frequency divider and the output signal of the second frequency divider as a clock; time difference detecting means for detecting a time difference when the first counter produces a count end signal and the second counter produces a count end signal by employing a signal generated from the output signal of the VCO; and VCO control data producing means for producing a signal used to switch the capacitor value of the VCO, or the inductor value thereof in response to the output signal of the time difference detecting means. With employment of such an arrangement, since the frequency of the output signal of the first frequency divider is compared with the frequency of the output signal of the second frequency divider to switch the resonant circuits of the VCO, the phase can be locked at a desirable frequency even in such a case that the first frequency divider is such a frequency divider employed in the fractional N type frequency synthesizer in which the phase of the output signal is instantaneously changed.

Then, the frequency synthesizer is featured by comprising: first and second counters for counting the output signal of the first frequency divider and the output signal of the second frequency divider as a clock; time difference detecting means for detecting a time difference when the first counter produces a count end signal and the second counter produces a count end signal by employing a signal generated from the output signal of the reference signal source; and VCO control data producing means for producing a signal used to switch the capacitor value of the VCO, or the inductor value thereof in response to the output signal of the time difference detecting means. With employment of such an arrangement, since the signal used to detect the time difference is constant irrespective of the oscillation frequency of the VCO, the precision in detecting of the time difference can be continuously kept constant.

Also, the frequency synthesizer is featured by comprising: a time difference judging means for resetting both the first counter and the second counter in response to the detection signal of the time difference detecting means, and for applying an arbitrary voltage to the control voltage terminal of the VCO so as to bring the output signal of the charge pump into the high impedance state in the case that the time difference detected by the time difference detecting means becomes a value defined within a predetermined time difference. With employment of such an arrangement, since the PLL is set to the closed loop after the frequency synthesizer confirms that the oscillation frequency of the VCO is approached to the desirable oscillation frequency, this frequency synthesizer can be phase-locked at the desirable oscillation frequency by using the optimum VCO control data.

Further, the frequency synthesizer is featured by comprising: a loop filter control means for outputting a signal causing a time constant of the loop filter to be varied in response to the output signal of the VCO control data producing means. With employment of such an arrangement, even when the control sensitivity of the VCO is varied in response to the VCO control data, since the frequency response characteristic of the PLL is corrected based upon the time constant of the loop filter, the stable C/N characteristic can be obtained irrespective of the VCO control data.

Then, the frequency synthesizer is featured by comprising: charge pump control means for outputting a signal used to vary a current capability of the charge pump in response to the output signal of the VCO control data producing means. With employment of such an arrangement, even when the control sensitivity of the VCO is varied in response to the VCO control data, since the frequency response characteristic of the PLL is corrected based upon the current capability of the charge pump, the stable C/N characteristic can be obtained irrespective of the VCO control data.

Also, the frequency synthesizer is featured by comprising: a reset signal generation means for outputting a signal which is synchronized with the output signal of the reference signal source to both a reset terminal of the first frequency divider and a reset terminal of the second frequency divider when the operation of the frequency adjusting means is commenced. With employment of such an arrangement, since the starting time instant of the frequency dividing operation by the first frequency divider can be made coincident with the starting time instant of the frequency dividing operation by the second frequency divider, the detection precision of the time difference detecting means can be furthermore improved.

Then, the frequency synthesizer is featured by comprising: a first delay means for delaying the clock signal of the first counter, or the clock signal of the second counter. With employment of such an arrangement, since the starting time instant of the frequency dividing operation by the first frequency divider can be made coincident with the starting time instant of the frequency dividing operation by the second frequency divider, the detection precision of the time difference detecting means can be furthermore improved.

Then, the frequency synthesizer is characterized by comprising: a second delay means for delaying the output signal of the reset signal generation means to output the delayed signal to both the reset terminal of the first frequency divider and the reset terminal of the second frequency divider. With employment of such an arrangement, since the time duration defined after the resonant circuit of the VCO has been switched until the frequency becomes stable can be secured, the frequency can be adjusted in higher precision.

Furthermore, according to the present invention, this frequency synthesizer is provided in a wireless mobile appliance. With employment of such an arrangement, it is possible to provide a compact wireless mobile appliance manufactured in low cost, while improving a communication quality thereof.

Then, according to the present invention, this frequency adjusting means 9 is provided in a wireless base station apparatus. With employment of such an arrangement, it is possible to provide a compact wireless base station apparatus made in low cost, while improving a communication quality thereof.

DESCRIPTION OF THE PREFERRED EMBODIMENTS

Figure 5:
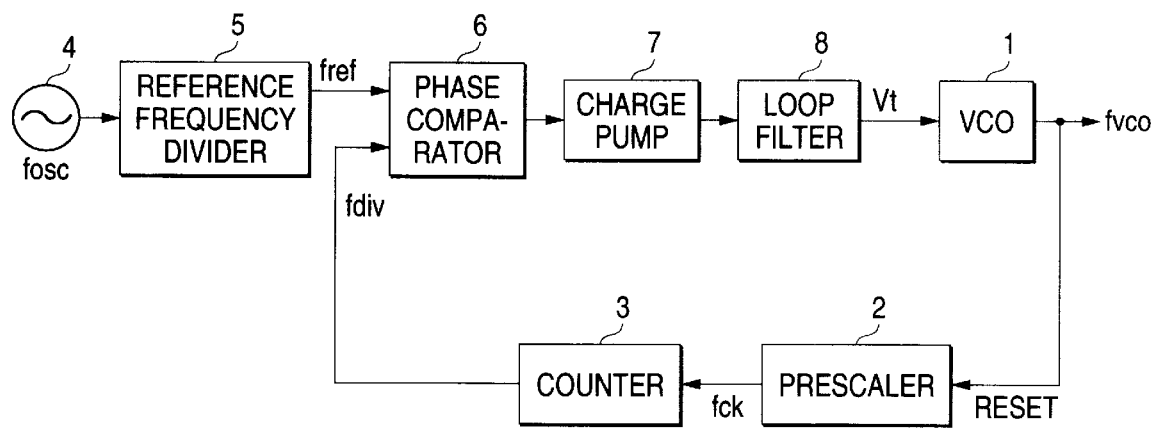
FIG. 5 is a block diagram of the conventional frequency synthesizer.
Figure 6:
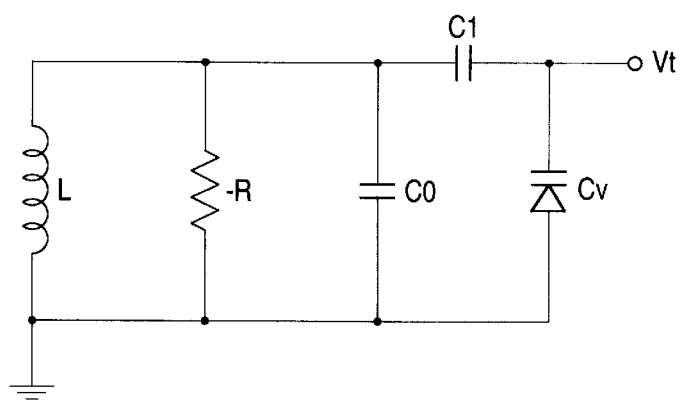
FIG. 6 is a circuit diagram for showing the basic idea of the voltage-controlled oscillator employed in the conventional frequency synthesizer.

Referring now to drawings, various embodiment modes of the present invention will be described. It should be understood that the same reference numerals shown in the prior art of FIG. 5 and FIG. 6 will be employed as those for denoting the same, or similar constructive elements of a frequency synthesizer according to the present invention, and therefore, detailed description thereof are omitted.

Figure 1:
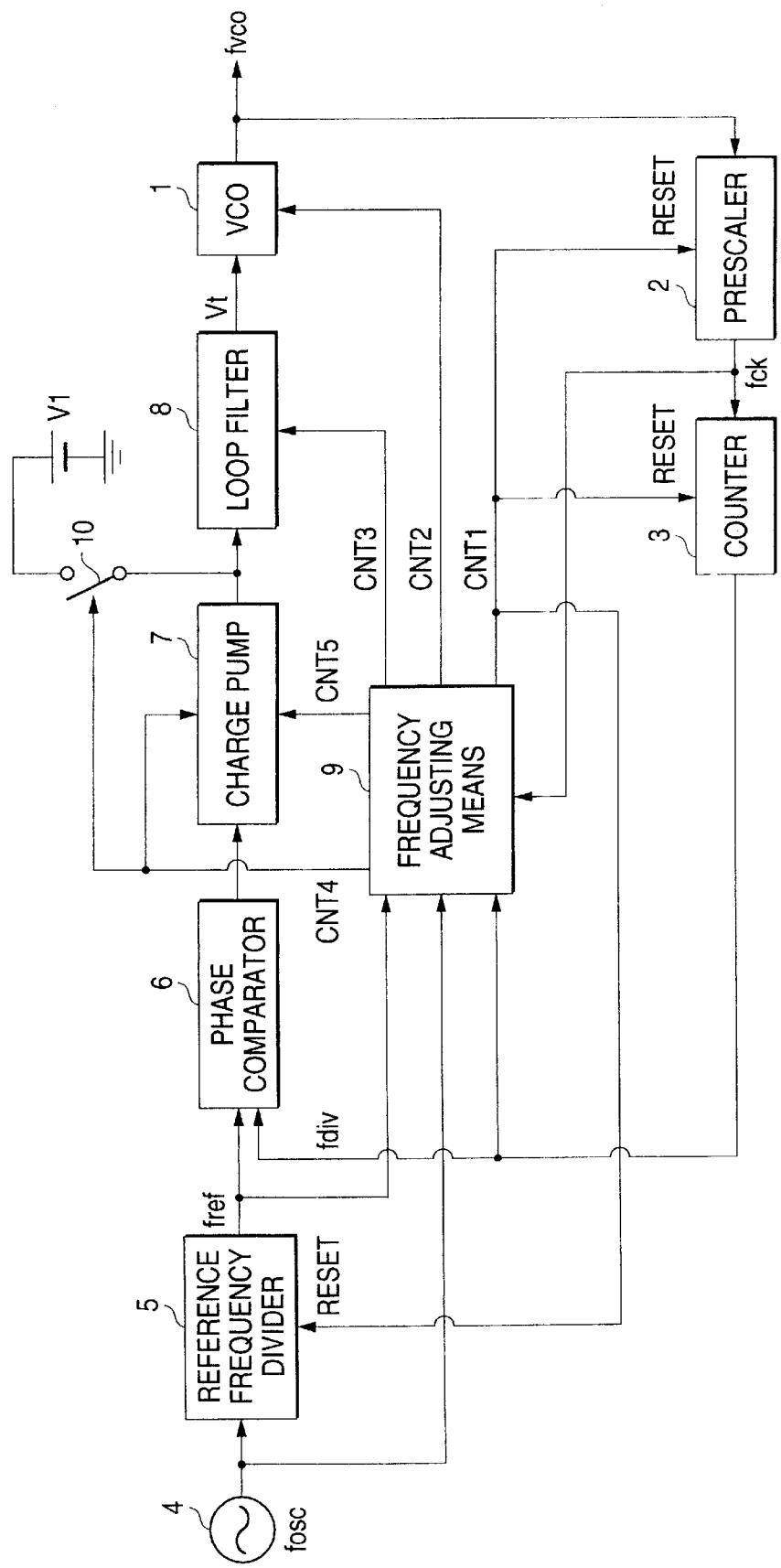
FIG. 1 is a block diagram for indicating a frequency synthesizer according to an embodiment mode of the present invention.

FIG. 1 is a block diagram for representing a circuit arrangement of a frequency synthesizer according to an embodiment mode of the present invention. This frequency synthesizer owns a different technical point from that of the conventional frequency synthesizer. That is, this frequency synthesizer is comprised of a frequency adjusting means 9 and a switch 10. In this frequency adjusting means 9, an output signal "$f_{osc}$" of a reference signal source 4, an output signal "$f_{ref}$" of a reference frequency divider 5, and an output signal "$f_{div}$" of a counter 3 are inputted to the frequency synthesizer. Also, a signal "CNT1" is outputted to the respective reset terminals of a prescaler 2, of a counter 3, and of the reference frequency divider 5. Another signal "CNT2" is outputted to a VCO 1, another signal "CNT3" is outputted to a loop filter 8, another signal "CNT4" is outputted to both a charge pump 7 and a switch 10, and a further signal "CNT5" is outputted to the charge pump 7 from this frequency adjusting means 9. The above-described switch 10 applies a voltage "V1" to the loop filter 8 in response to the signal CNT4.

Figure 2:
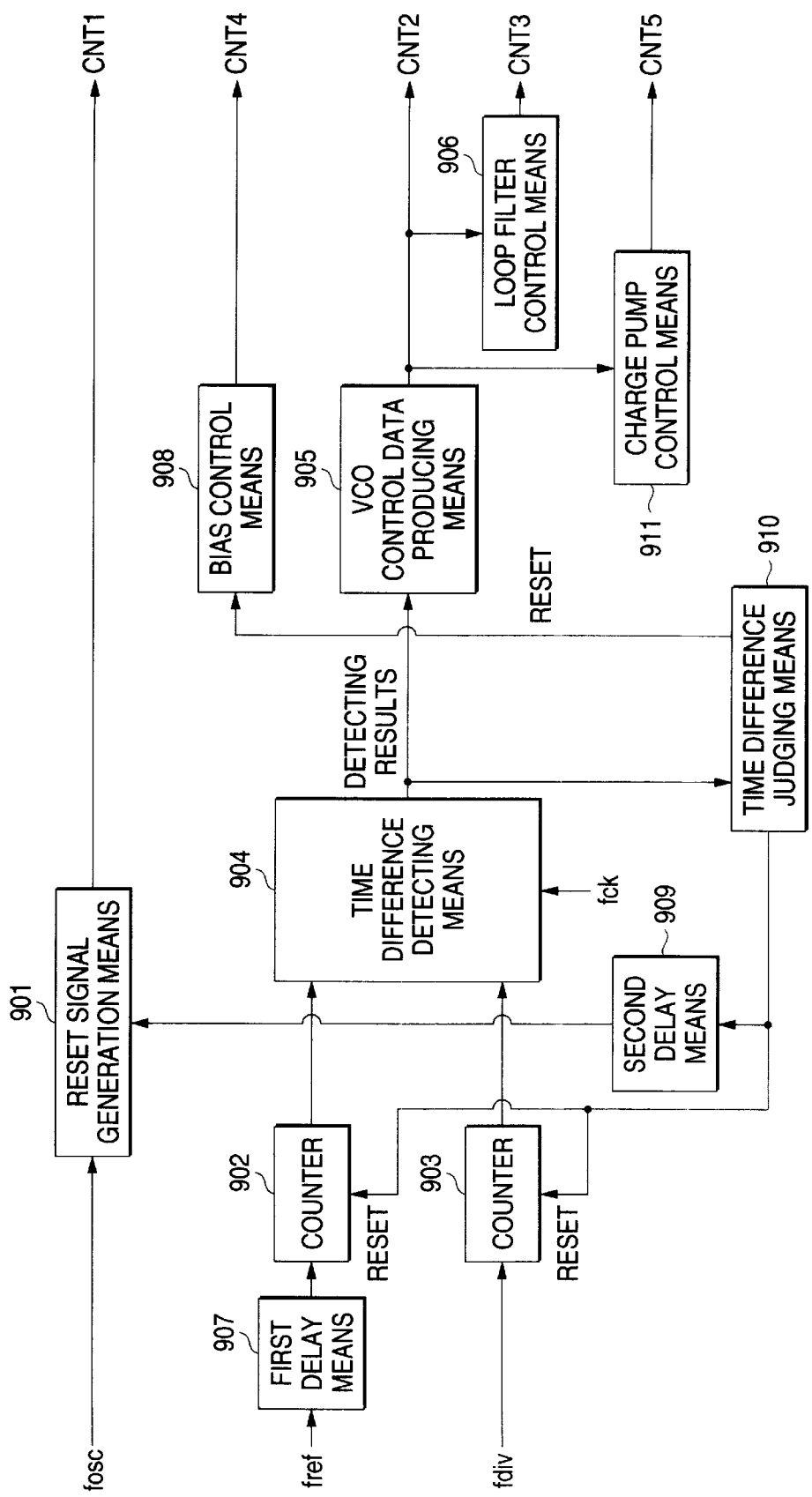
FIG. 2 is a block diagram for showing a frequency adjusting means employed in the frequency synthesizer according to the embodiment mode of the present invention.

FIG. 2 is a block diagram for indicating an arrangement of the frequency adjusting means 9. The output signal "$f_{ref}$" of the reference frequency divider 5 is inputted via a first delay means 907 to a counter 902, and the output signal "$f_{div}$" of the counter 3 is entered to a counter 903. Output signals produced in such a case that both the counter 902 and the counter 903 have accomplished the same numbers of counting operations are entered into a time difference detecting means 904, respectively. Also, the output signal "$f_{osc}$" of the reference signal source 4 is inputted to a reset signal generation means 901, and the reset signal generation means 901 outputs the signal "CNT1." An output signal "$f_{ck}$" of the prescaler 2 is inputted to the time difference detecting means 904 as a clock used to measure a time difference. The time difference detecting means 904 outputs a detection result of a time difference when the counting operation by the counter 902 is ended, and the counting operation by the counter 903 is ended to both a time difference judging means 910 and a VCO control data producing means 905. The time difference judging means 910 outputs a signal to a reset terminal of the counter 902 and a reset terminal of the counter 903, and also outputs a signal via a second delay means 909 to the reset signal generation means 901. A bias control means 908 outputs the signal CNT4 in response to the output signal of the time difference judging meas 910. The signal CNT2 outputted from the VCO control data producing means 905 is inputted to both a loop filter control means 906 and a charge pump control means 911, so that the loop filter control means 906 outputs the signal CNT3, and the charge pump control means 911 outputs the signal CNT5.

Figure 3:
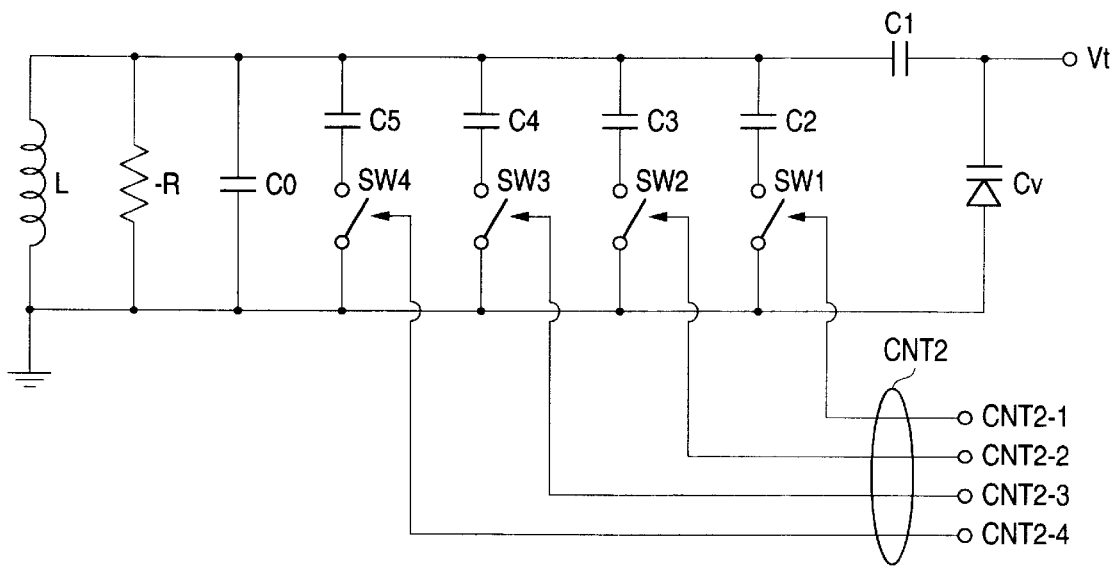
FIG. 3 is a circuit diagram for representing a basic idea of a voltage-controlled oscillator employed in the frequency synthesizer according to the embodiment mode of the present invention.

FIG. 3 is a structural diagram for showing a basic idea of the VCO 1. In this drawing, symbol "CNT2" indicates a bus line made by bundling CNT2-1 to CNT2-4. This VCO 1 owns such a technical different point from that shown in FIG. 6. That is, this VCO 1 shown in FIG. 3 is equipped with switches SW1 to SW4, which are controlled by the bus lines CNT2-1 to CNT2-4, and also capacitors C2 to C5, which are connected to these switches SW1 to SW4 in a cascade connection manner.

Figure 4:
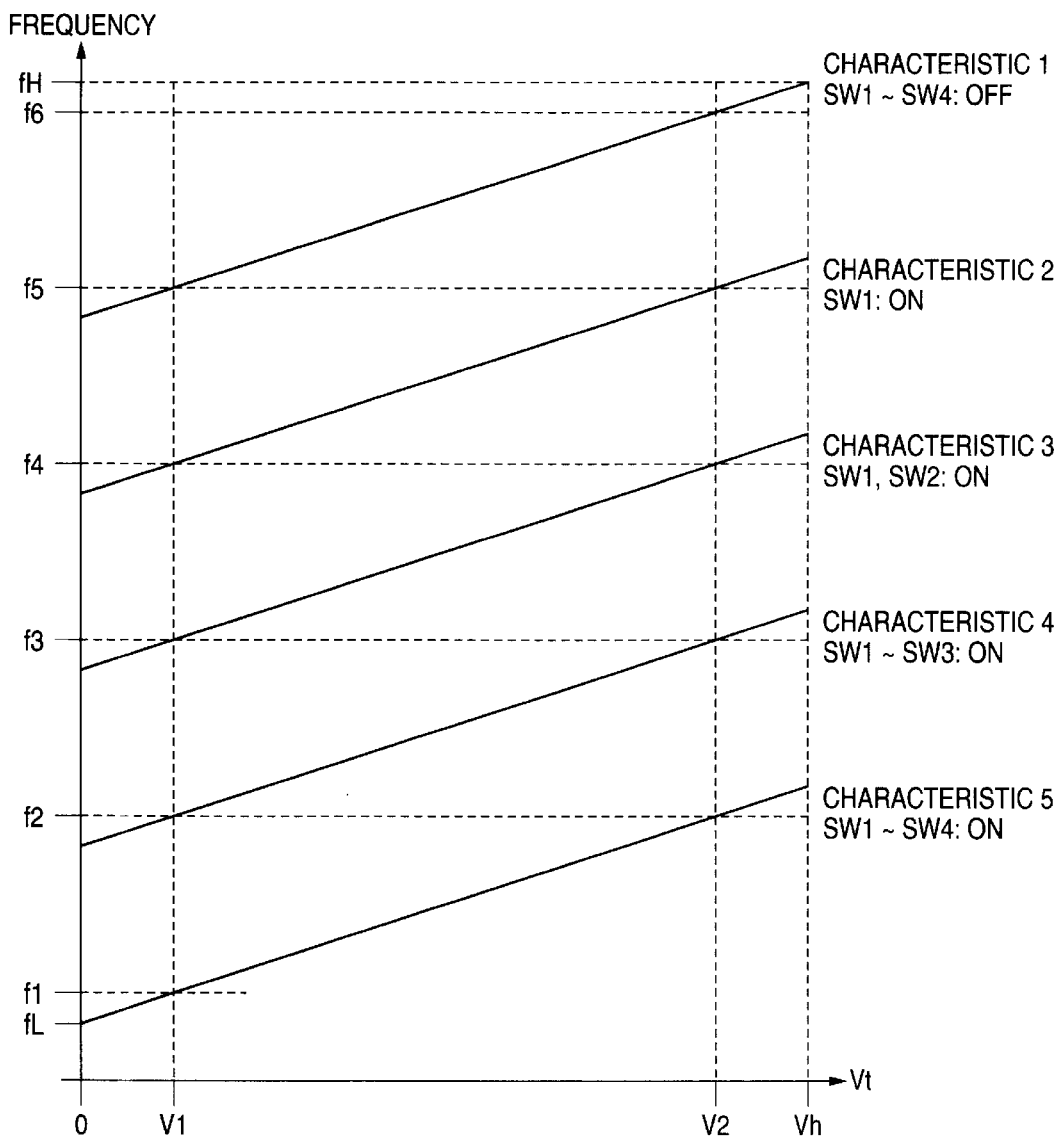
FIG. 4 is a diagram for indicating a control voltage-to-oscillation frequency characteristic of the voltage-controlled oscillator employed in the frequency synthesizer of the embodiment mode of the present invention.

FIG. 4 is a graphical representation for representing a control voltage-to-oscillation frequency characteristic of the voltage-controlled oscillator shown in FIG. 3. Referring now to FIG. 4, operation of the voltage-controlled oscillator will be explained. It is now assumed that capacitance values of the variable capacitance diode "Cv" are equal to "Cv1" and "Cv2" when voltages "V1" and "V2" are applied to this variable capacitance diode Cv as the control voltage "Vt." In such a case that the control voltage Vt=V1 and all of the switches SW1 to SW4 are turned OFF (namely, characteristic 1 shown in FIG. 4), the oscillation frequency of this VCO is expressed by the following formula [2]:

$$f_{VCO} = \frac{1}{2}\pi\sqrt{L[C0 + C1 \cdot Cv1/(C1 + Cv1)]} \qquad [2].$$

When the control voltage Vt=V2, and the switch SW1 is turned ON (namely, characteristic 2 of FIG. 4), the oscillation frequency is expressed by the below-mentioned formula [3]:

$$f_{VCO} = \frac{1}{2}\pi\sqrt{L[C0 + C2 + C1 \cdot Cv2/(C1 + Cv2)]} \qquad [3].$$

In order that the oscillation frequency defined in the formula [2] is made equal to that defined in the formula [3], using the following equation of:

C1·Cv1/(C1+Cv1)=C2+C2·Cv2/(C1+Cv2), the capacitance value "C2" may be set to such a value defined by the below-mentioned formula [4]:

$$C2 = C1^2(Cv1 - Cv2)/(C1 + Cv1)(C1 + Cv2) \qquad [4].$$

While a similar study is made, in the case that the value of the capacitor is set to a value defined by the below-mentioned formula [5], when the switch SW2 is turned ON, a characteristics of FIG. 4 is obtained. Also, when the switches SW1 to SW3 are turned ON, a characteristic 4 of FIG. 4 is obtained. When the switches SW1 to SW4 are turned ON, a characteristic 5 of FIG. 4 is obtained.

$$C2=C3=C4=C5=C1^2(Cv1-Cv2)/(C1+Cv1)(C1+Cv2) \quad [5].$$

As a consequence, under control of the control voltage Vt and the bus lines CNT1 to CNT4, as represented in FIG. 4, the oscillation frequency is changed from "fL" when Vt=0 up to "fH" when Vt=VH. In this case, the VCO 1 is assumed to be designed even when there are manufacturing fluctuations occurred in the electronic circuit elements which constitute the VCO 1, a desirable frequency is located within a frequency range from "fL" up to "fH."

Next, a description will now be made of operations of the frequency synthesizer shown in FIG. 1 and FIG. 2. When the count value of the counter 3 is changed which is set outside the frequency synthesizer, the reset signal generation means 901 generates the reset pulse CNT1 which is synchronized with the frequency "$f_{OSC}$", and then supplies this reset pulse CNT1 to the reference frequency divider 4, the prescaler 2, and the counter 3 so as to reset these circuit elements. At the same time, the bias control means 908 brings the output signal of the charge pump 7 to be brought into a high impedance state, and also applies the voltage V1 via the switch 10 to the output signal of the charge pump 7. At this time, the bias control means 908 turns ON the switches SW1 and SW2, so that the VCO 1 is oscillated at the frequency "f3."

As to the output signal "$f_{ref}$" of the reference frequency divider 4 and the output signal "$f_{div}$" of the counter 3, the counter 902 and the counter 903 count the same preselected numbers, respectively. When the counter 902 and the counter 903 accomplish the preselected count numbers respectively, these counters 902 and 903 output count end signals. At this time, since the frequency of the output signal "$f_{ref}$" is different from the frequency of the output signal "$f_{div}$", there is a difference between a count end time instant of the counter 902 and a count end time instant of the counter 903. The time difference detecting means 904 counts how many pulses of the output signals "$f_{ck}$" are produced from the prescaler 2 within this time difference. Since the oscillation frequency of the VCO 1 may be approximated based upon this count result at this stage, the VCO control data producing means 905 outputs as "CNT2", such control data capable of causing the VCO 1 to be oscillated at a target frequency. When the count value defined by the output signal "$f_{ck}$" of the prescaler 2 exceeds a predetermined value, the time difference judging means 910 resets both the counter 902 and the counter 903, and also supplies a signal via the delay means 909 to the reset signal generation means 901. Upon receipt of the signal supplied from the delay means 909, the reset signal generation means 901 outputs the signal "$f_{OSC}$" as CNT1 at this reception timing. As a result, this reset signal generation means 901 resets the reference frequency divider 5, the prescaler 2, and the counter 3, and then, commences to again perform the frequency adjusting operation.

While a similar process operation is repeatedly carried out, when a count value defined by the next output signal "$f_{ck}$" of the prescaler 2 is located within a preselected value, the time difference judging means 910 releases via the bias control means 908 the high impedance state of the output signal from the charge pump 7, and also releases applying of the voltage V1 via the switch 10 to the output of the charge pump 7. At this time, in response to the control data of the VCO control data producing means 905, the loop filter control means 906 switches the time constant of the loop filter 8. Also, in response to the control data outputted form the VCO control data producing means 905, the charge pump control means 911 switches the current capability of the charge pump 7. Thereafter, the frequency synthesizer is returned to the normal PLL operation, so that the frequency synthesizer is phase-locked.

It should be noted that there are four sets of resonant circuit switching units of the VCO 1 in the above-explained description. Alternatively, even when any other sets larger than, or smaller than the four sets are employed, the resonant circuit switching unit may be similarly realized. In particular, when a total number of these resonant circuit switching units is larger than 4, since the control sensitivity of the VCO per 1 stage can be lowered, the C/N characteristic may be improved. Also, in the above-explained description, the frequency of the resonant circuit is varied in such a manner that the switch is turned ON/OFF so as to connect, or disconnect the capacitor (fixed capacitance). Alternatively, the resonant frequency may be varied in such a way that either the variable capacitance diodes or the inductors are connected, or disconnected. In other words, the resonant frequency may be varied by connecting, or disconnecting either the capacitors (fixed capacitances, variable capacitances) or the inductors.

As previously described, in accordance with the frequency synthesizer of this embodiment mode, even when there are the manufacturing fluctuations contained in the circuit elements which constitute the VCO 1, since the resonant frequency of the parallel resonant circuit is changed in response to the actual oscillation frequency of the VCO 1, this frequency synthesizer can be phase-locked at a desirable frequency. Moreover, since the VCO 1 can be manufactured in the IC form, the compact VCO 1 can be made in low cost.

Also, since the resonant circuits of the VCO 1 are switched by comparing the frequency of the output signal "$f_{div}$" with the frequency of the output signal "$f_{ref}$", the frequency synthesizer can be phase-locked at the desirable frequency even when the pulse-swallow type frequency divider is such a frequency divider in which the phase of the output signal is instantaneously changed. This frequency divider is employed in the generally known fractional N type frequency synthesizer.

Furthermore, since the PLL is set to the closed loop after such a confirmation is made such that the oscillation frequency of the VCO 1 is approximated to a desirable oscillation frequency, the frequency synthesizer can be phase-locked at this desirable frequency by employed in the optimum VCO control data.

Also, in order that the frequency changing time of the VCO 1 is eliminated which occurs just after the VCO control has been changed, the delay means 909 is inserted into the frequency synthesizer. As a result, the frequency can be adjusted in higher precision.

Furthermore, the time difference detecting means 904 is arranged in such a manner that the output signal "$f_{ck}$" is counted. Alternatively, the time difference detecting means 904 may be similarly realized by using such a signal obtained by multiplying the output signal of the reference signal source 4. In this alternative case, since the frequency of the signal to be counted is constant irrespective of the oscillation frequency of the VCO 1, the detection precision of the time difference can be continuously secured under stable condition.

Then, even when the control sensitivity of the VCO 1 is changed in response to the VCO control data, since the frequency response characteristic of the PLL is corrected based upon the time constant of the loop filter 8, the stable C/N characteristic can be obtained irrespective of the VCO control data.

Also, even when the control sensitivity of the VCO 1 is changed in response to the VCO control data, since the frequency response characteristic of the PLL is corrected based upon the current capability of the charge pump 7, the constant C/N characteristic can be obtained irrespective of the VCO control data. Since the correction by the current capability of the charge pump 7 may be realized by, for example, changing a total number of parallel transistors of the charge pump 7, the frequency response characteristic may be corrected in a more fine manner, as compared with the correction by employing the loop filter 8.

In addition, in such a case that the starting time instant of the frequency dividing operation by the reference frequency divider 5 is not made coincident with the starting time instant of the frequency dividing operation by the pulse-swallow type variable frequency divider which is constituted by the prescaler 2 and the counter 3, there is a shift between the end time instant of the counting operation of the counter 902 for counting the output signal "$f_{div}$" and the time instant of the counting operation of the counter 903 for counting the output signal "$f_{ref}$." As a consequence, in order to make the starting time instants of the frequency dividing operations coincident with each other, the reset signal CNT 1 is synthesized with the output signal "$f_{OSC}$." As a result, since the starting time instant of the frequency dividing operation by the reference frequency divider 5 can be made coincident with the time instant when the reset of the reference frequency divider 5 is released, the detection precision of the time difference detecting means 904 can be improved.

Also, precisely speaking, there is such an opportunity that a time instant when the reset signal CNT1 is inputted into the reference frequency divider 5 is not made coincident with a time instant when the reset signal CNT1 is entered into the prescaler 2. In the case that such time when the reset signal CNT1 is reached to the prescaler 2 is delayed, as compared with the time when the reset signal CNT1 is reached to the reference frequency divider 5, the signal "$f_{ref}$" entered into the counter 902 is delayed only by a difference between two sets of the propagation delay time. As a result, the propagation delay time error of the reset signal CNT1 is corrected, and the detection precision of the time difference detecting means 904 can be furthermore improved.

Also, in such a case that the frequency synthesizer of this embodiment mode is provided with the wireless mobile appliance, the compact wireless mobile appliance made in low cost can be realized with having the better communication quality.

Also, in such a case that the frequency synthesizer of this embodiment mode is provided with the wireless base station apparatus, the compact wireless base station apparatus made in low cost can be realized with having the better communication quality.

As previously described, in accordance with the present invention, it is possible to provide such a frequency synthesizer that the VCO having the better C/N characteristic and also the wide output frequency range can be manufactured in the IC form and in low cost.

Also, since this frequency synthesizer is provided in the wireless mobile appliance and the wireless base station apparatus, it is possible to obtain the compact wireless mobile apparatus having the better communication quality and also the compact wireless base station apparatus having the better communication quality, which are made in low cost.

What is claimed is:

1. In a frequency synthesizer having a switching means for switching a capacitor, or an inductor; and equipped with:
    a VCO, voltage-controlled oscillator, for oscillating a signal having a frequency in response to a voltage applied to a control voltage terminal;
    a first frequency divider for outputting at least a signal having a frequency which is obtained by dividing a frequency of an output signal derived from said VCO;
    a second frequency divider for dividing a frequency of a reference signal;
    a phase comparator for comparing a phase of an output signal of said first frequency divider with a phase of an output signal of said second frequency divider to output a phase difference thereof;
    a charge pump for outputting the output signal of said phase comparator via a loop filter to a control voltage terminal of said VCO; and
    frequency adjusting means for detecting a frequency error between both the output signal of said first frequency divider and the output signal of said second frequency divider, and for switching the capacitor value of said VCO, or the inductor value thereof in accordance with said detection result of the frequency error; wherein
        said frequency adjusting means includes at least a first counter and a second counter for counting the output signals of said first frequency divider and said second frequency divider respectively, and time difference detecting means for detecting a time difference between a count end signal produced by the first counter and a count end signal being produced by the second counter, based on a signal generated by said first frequency divider, further wherein
        said frequency error is detected in response to the output signal of said time difference detecting means.

2. A frequency synthesizer as claimed in claim 1 wherein: said VCO includes a plurality of means for switching capacitors, or inductors.

3. A frequency synthesizer as claimed in claim 1 further comprised of:
    VCO control data producing means for producing a signal used to switch the capacitor value of said VCO, or the inductor value thereof in response to the output signal of said time difference detecting means.

4. A frequency synthesizer as claimed in claim 1 further comprised of:
    VCO control data producing means for producing a signal used to switch the capacitor value of said VCO, or the inductor value thereof in response to the output signal of said time difference detecting means, wherein
        the time difference detecting means detects the time difference by employing a signal generated from the output signal of said reference signal source.

5. A frequency synthesizer as claimed in claim 1 wherein: said frequency synthesizer is further comprised of:
    time difference judging means for resetting both said first counter and said second counter in response to the detection signal of the time difference detecting means, and for applying an arbitrary voltage to the control voltage terminal of said VCO so as to bring the output signal of the charge pump into the high impedance state in the case that the time difference detected by the time difference detecting means becomes a value defined within a predetermined time difference.

6. A frequency synthesizer as claimed in any one of the preceding claims 3 to 5 wherein:
said frequency synthesizer is further comprised of:
loop filter control means for outputting a signal causing a time constant of the loop filter to be varied in response to the output signal of said VCO control data producing means.

7. A frequency synthesizer as claimed in any one of the preceding claims 3 to 5 wherein:
said frequency synthesizer is further comprised of:
charge pump control means for outputting a signal used to vary a current capability of said charge pump in response to the output signal of the VCO control data producing means.

8. A frequency synthesizer as claimed in any one of the preceding claims 3 to 5 wherein:
said frequency synthesizer is further comprised of:
reset signal generation means for outputting a signal which is synchronized with the output signal of the reference signal source to both a reset terminal of said first frequency divider and a reset terminal of said second frequency divider when the operation of said frequency adjusting means is commenced.

9. A frequency synthesizer as claimed in any one of the preceding claims 3 to 5 wherein:
said frequency synthesizer is further comprised of:
first delay means for delaying the clock signal of the first counter, or the clock signal of the second counter.

10. A frequency synthesizer as claimed in claim 5 wherein:
said frequency synthesizer is further comprised of:
second delay means for delaying the output signal of said reset signal generation means to output the delayed signal to both the reset terminal of said first frequency divider and the reset terminal of said second frequency divider.

11. A wireless mobile appliance comprising:
the frequency synthesizer as recited in any one of the preceding claims 1 to 5.

12. A wireless base station apparatus comprising:
the frequency synthesizer as recited in any one of the preceding claims 1 to 5.

13. In a frequency producing method in which
a VCO having a switching means for switching a capacitor, or an inductor oscillates a signal having a frequency in response to a voltage applied to a control voltage terminal;
a first frequency divider outputs at least a signal having a frequency which is obtained by dividing a frequency of an output signal derived from said VCO;
a second frequency divider divides a frequency of a reference signal;
a phase comparator compares a phase of an output signal of said first frequency divider with a phase of an output signal of said second frequency divider to output a phase difference between said phases;
a charge pump outputs a signal outputted from said phase comparator to a control voltage terminal of said VCO via a loop filter;
said frequency producing method characterized in that:
frequency adjusting means detects a frequency error between the output signal of said first frequency divider and the output signal of said second frequency divider, and then outputs a signal used to switch the capacitor value, or the inductor value in response to the detection result of said frequency error;
first and second counters count the output signal of said first frequency divider and the output signal of said second frequency divider respectively; and
time difference detecting means detects a time difference between a count end signal produced by the first counter and a count end signal produced by the second counter based on a signal generated by said first frequency divider; wherein
said frequency error is detected in response to the output signal of said time difference detecting means.

14. A frequency producing method as claimed in claim 13 wherein:
said VCO switches a plurality of capacitors, or a plurality of inductors.

15. A frequency producing method as claimed in claim 13 wherein:
VCO control data producing means produces a signal used to switch the capacitor value of said VCO, or the inductor value thereof in response to the output signal of said time difference detecting means.

16. A frequency producing method as claimed in claim 13 wherein:
the time difference detecting means detects the time difference between the first counter count end signal and the second counter count end signal by employing a signal generated from the output signal of a reference signal source; and
VCO control data producing means produces a signal used to switch the capacitor value of said VCO, or the inductor value thereof in response to the output signal of said time difference detecting means.

17. A frequency producing method as claimed in claim 15 wherein:
time difference judging means resets both said first counter and said second counter in response to the detection signal of the time difference detecting means, and applies an arbitrary voltage to the control voltage terminal of said VCO so as to bring the output signal of the charge pump into the high impedance state in the case that the time difference detected by the time difference detecting means becomes a value defined within a predetermined time difference.

18. A frequency producing method as claimed in any one of the preceding claims 15 to 17 wherein:
loop filter control means outputs a signal causing a time constant of the loop filter to be varied in response to the output signal of said VCO control data producing means.

19. A frequency producing method as claimed in any one of the preceding claims 15 to 17 wherein:
charge pump control means outputs a signal used to vary a current capability of said charge pump in response to the output signal of the VCO control data producing means.

20. A frequency producing method as claimed in any one of the preceding claims 15 to 17 wherein:
reset signal generation means outputs a signal which is synchronized with the output signal of the reference signal source to both a reset terminal of said first frequency divider and a reset terminal of said second frequency divider when the operation of said frequency adjusting means is commenced.

21. A frequency producing method as claimed in any one of the preceding claims 15 to 17 wherein:
   first delay means delays the clock signal of the first counter, or the clock signal of the second counter.

22. A frequency producing method as claimed in claim 17 wherein:

second delay means delays the output signal of said reset signal generation means to output the delayed signal to both the reset terminal of said first frequency divider and the reset terminal of said second frequency divider.

* * * * *